United States Patent [19]
Komatsu et al.

[11] Patent Number: 4,910,398
[45] Date of Patent: Mar. 20, 1990

[54] PATTERN MEASUREMENT METHOD

[75] Inventors: Fumio Komatsu, Fuchu; Katsuya Okumura, Yokohama, both of Japan

[73] Assignee: Kabushiki Kaisha Toshiba, Kawasaki, Japan

[21] Appl. No.: 257,862

[22] Filed: Oct. 14, 1988

[30] Foreign Application Priority Data

Oct. 14, 1987 [JP] Japan .................. 62-259207

[51] Int. Cl.$^4$ .............................................. H01J 31/28
[52] U.S. Cl. ..................................... 250/307; 250/310; 382/22; 356/376
[58] Field of Search ................... 250/307, 310; 382/22; 356/376

[56] References Cited

U.S. PATENT DOCUMENTS 4,725,730 2/1988 Kato et al. ........................... 250/307

FOREIGN PATENT DOCUMENTS 61-128114 6/1986 Japan ..................................... 250/307

Primary Examiner—Jack I. Berman
Attorney, Agent, or Firm—Foley & Lardner, Schwartz, Jeffery, Schwaab, Mack, Blumenthal & Evans

[57] ABSTRACT

This method is a method of measuring a taper angle, a thickness or a depth of a semiconductor integrated circuit pattern. Electron beam, light beam or the like is irradiated to a semiconductor integrated circuit pattern provided on a reference plane, thus to form a projected image. The projected image forms a predetermined angle with respect to a reference line set with respect to the reference plane. Then, lengths in a direction of the reference line of the projected images of symmetrical side walls of the pattern are measured to calculate from the ratio of those lengths and angle that the side walls and the reference plane form.

13 Claims, 4 Drawing Sheets

PATTERN MEASUREMENT METHOD

BACKGROUND OF THE INVENTION

1. Field of the Art

This invention relates to a pattern measurement method, and more particularly to a pattern measurement method for measuring a taper angle, a thickness or a depth of a semiconductor integrated circuit pattern.

2. Prior Art

In the manufacturing process of semiconductor integrated circuits, there occurs a need to measure a taper angle, a thickness or a depth for various patterns formed on the semiconductor substrate. Ordinarily known conventional methods for measuring such a fine pattern are as follows.

(1) Method of cleaving a sample to observe its cross section by a scanning electron microscope.

(2) Method of vacuum-depositing gold onto a sample to irradiate an electron beam thereto to use a scanning electron microscope provided with a pair of electron detectors arranged symmetrically with respect to the electron beam, thus to conduct a signal processing, e.g., calculation of sum of signals obtained by a pair of detectors and difference therebetween, etc.

(3) Method of using the principle of a stereoscopy widely used in the field of remote sensing to apply image processing to secondary electron images observed from two different directions to implement a processing such that both images match with each other, thereafter to make a measurement using a geometrical relational equation.

Problems to be Solved by the Invention (1) Because a sample is destroyed with the above-described method (1), this sample can be no longer used at the subsequent steps. Moreover, observable patterns are limited to patterns appearing on the cleavage surface, so that it is difficult to measure an arbitrary pattern. Further, also in the case where the cleavage position deviates from the pattern center, precise measurement becomes difficult.

(2) Because gold is vacuum-deposited onto the sample with the above-described method (2) as well, this sample can be no longer used at the subsequent step. Moreover, because two detectors are used, a work for calibrating outputs of both detectors from every patterns to be measured is required, resulting in the necessity of considerable skillfulness in measurement. Further, when patterns to be measured come to submicron order in dimension, measurement is affected by interference between patterns adjacent to each other, so that high accuracy measurement becomes difficult.

(3) The above-described method (3) has the merit that it is possible to measure an arbitrary pattern on a sample in non-destructive and non-contact manners. However, it is necessary to make high accuracy angular measurements for two different directions, respectively. In addition, since high accuracy image matching must be conducted within a short time period, resulting in difficulty in measurement with high accuracy.

SUMMARY OF THE INVENTION

With the above in view, an object of this invention is to provide a high accuracy pattern measurement method in non-destructive and non-contact manners.

This invention provides a method of measuring a pattern having first and second side walls which are uneven with respect to a reference plane and are plane-symmetrical with each other with respect to a plane of symmetry raised vertical to the reference plane, the method comprising the steps of:

obtaining a projected image of a pattern onto a plane of projection which forms a predetermined angle $\theta$ with respect to the reference plane;

defining a reference line which is a straight line orthogonal to an intersecting line of the plane of symmetry and the plane of projection, and included in the plane of projection to obtain a width $x_1$ in a direction of the reference line of a projected image of the first side wall and a width $x_2$ in the direction of the reference line of a projected image of the second side wall; and obtaining an angle $\phi$ that the side walls and the reference plane form using an equation expressed as:

$$\cos(\phi+\theta)/\cos(\phi-\theta) = x_1/x_2.$$

In addition, this invention provides a pattern measurement method comprising the steps of obtaining projected points P' and Q' for predetermined points P and Q on the side wall, respectively, obtaining a spacing d along the reference line between the projected points P' and Q', and obtaining a spacing H with respect to a normal direction raised on the reference plane between the predetermined points P and Q using an equation expressed as:

$$H = d \cdot \sin\phi/\cos(\phi+\theta).$$

In accordance with this invention, a pattern is projected onto a plane of projection which forms a predetermined angle $\theta$ with respect to the reference plane to implement a geometrical operation to data obtained from the projected image thus obtained, to thereby obtain an angle $\phi$ and a distance H. Thus, measurement can be made without destroying the sample and without being in contact therewith. The projected image of pattern may be obtained, e.g., by irradiating an electron beam to a pattern from a predetermined direction to observe secondary electron image.

The method according to this invention has no necessity of allowing projected images onto two different planes of projection to match with each other differently from a conventional measurement method using the principle of stereoscopy, thus permitting measurement only by obtaining one projected image. As a result, simple and speedy measurement is enabled.

The method according to this invention is directed to measurement of a pattern having two side walls which are uneven with respect to the reference plane and are plane-symmetrical with each other with respect to a plane of symmetry raised vertical to the reference plane. The essential condition of this invention is that a pattern has symmetry. By utilizing this symmetry, a necessary measurement can be made using only one projected image.

DETAILED DESCRIPTION OF THE INVENTION

Figure 1A:
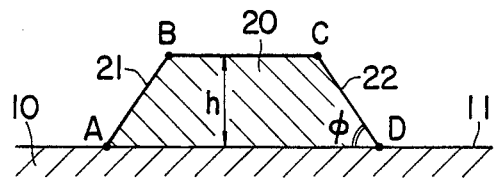
FIG. 1(a, b) is a cross sectional view of a convex pattern for explaining the fundamental principle of this invention.

Initially, the fundamental principle of this invention will be described. FIG. 1 is a cross sectional view of a convex pattern for explaining this fundamental principle. As shown in FIG. 1(a), a convex portion 20 is formed on a reference plane 11 of a substrate 10. This convex portion 20 has a cross section of a trapezoid ABCD as shown, and has first and second side walls 21 and 22. In accordance with a method of this invention, it is possible to obtain a taper angle $\phi$ and a height h of such a pattern consisting of the convex portion 20.

Figure 1B:
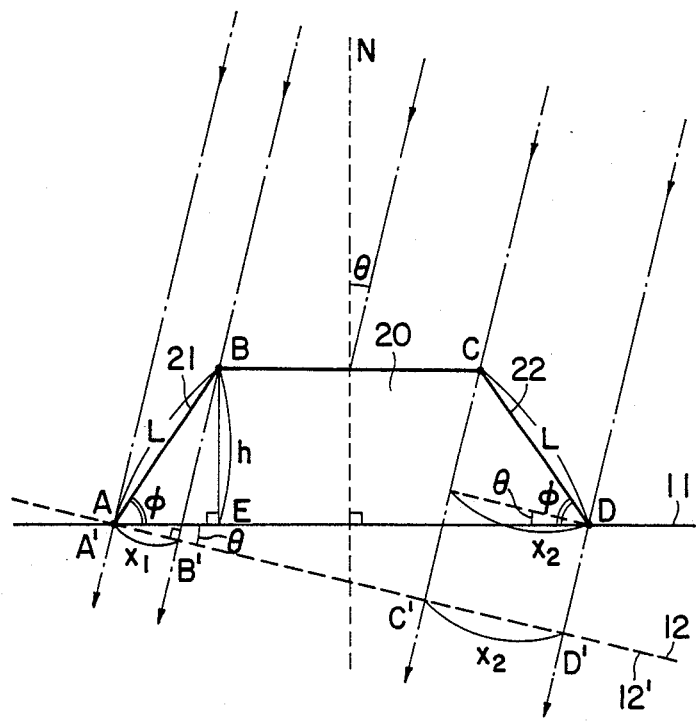

FIG. 1(b) is an enlarged view of the pattern shown in FIG. 1(a). On the reference plane 11, the trapezoid ABCD is placed or mounted on as a convex pattern. This trapezoid ABCD is symmetrical with respect to normal N raised on the reference plane 11 in the figure. Accordingly, the length of the first side wall 21 (i.e., the length of the side AB) and the length of the second side wall 22 (i.e., the length of the side CD) are equal to each other. Because the method according to this invention utilizes such a symmetry, the method of this invention cannot be applied to a pattern which has not such a symmetry.

Now, a plane of projection 12 which forms a predetermined angle $\theta$ with respect to the reference plane 11 is assumed and a projected image onto the plane of projection 12 of the convex portion 20 is assumed. This projection is obtained by irradiating a beam in a direction indicated by an arrow of single dotted lines in the figure (direction inclined by an angle $\theta$ with respect to the normal N). For example, by using an electron beam as a beam to observe secondary electron image, a projected image in this direction is obtained. When a light beam is used, it is sufficient to observe a reflected light from the convex portion 20.

Figure 2:
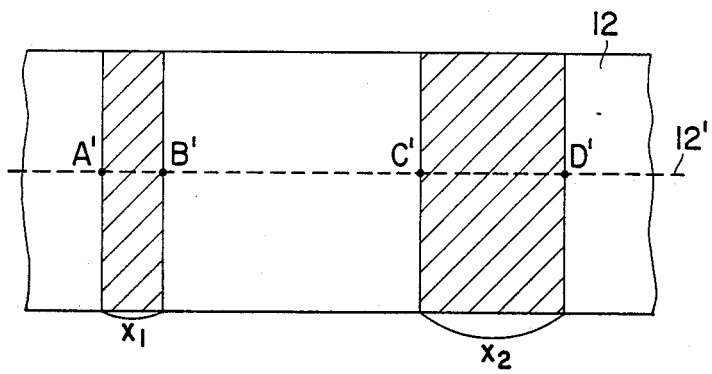
FIG. 2 shows a two-dimensional projected image of the convex pattern shown in FIG. 1.

Actually, the convex portion 20 which is a three-dimensional pattern is projected onto the plane of projection 12 which is a two-dimensional plane. For convenience of explanation, one dimensional projection image obtained by projecting the trapezoid ABCD corresponding to the cross section of the convex portion 20 onto a reference line 12' on the plane of projection 12 (the plane of projection 12 becomes a plane raised vertical to the paper along the reference line 12'. In FIG. 1(b), the plane of projection 12 and the reference line 12' are indicated by the same broken lines) will be described. By such a projection, points A, B, C and D are projected as points A', B', C' and D', respectively (the points A and A' are indicated by the same point in this figure). An actual two-dimensional image projected onto the plane of projection 12 is as shown in FIG. 2. In this example, the hatched portions indicate portions corresponding to side walls 21 and 22, respectively.

When projected images as shown in FIG. 2 are obtained, it is possible to determine a distance $x_1$ between points A' and B' and a distance $x_2$ between points C' and D'. Where secondary electron images are observed by means of an electron microscope, a real distance may be actually determined by multiplying a predetermined magnification. It is assumed that respective distances in the following description refer to actual dimensions obtained by multiplying an observed value by such a magnification. Distances $x_1$ and $x_2$ obtained in this case eventually become widths in a direction of the reference line 12' of projected images of the first and second side walls 21 and 22. When attention is drawn to the geometrical relationship between the actual length of each side wall and the widths $x_1$ and $x_2$, the following relational equation in regard to the first side wall 21 holds:

$$L \cos(\phi+\theta) = x_1 \quad (1),$$

and the following relational equation in regard to the second side wall 22 holds:

$$L \cos(\phi-\theta) = x_2 \quad (2).$$

From the above equations (1) and (2), $$\cos(\phi+\theta)/\cos(\phi-\theta) = x_1/x_2 \quad (3)$$

is obtained. In this instance, since $\theta$ is already known, e.g., as an irradiation angle of electron beam and $x_1$ and $x_2$ can be measured from the projected images shown in FIG. 2, the taper angle $\phi$ of each side wall can be eventually determined by the equation (3). The procedure for measuring taper angle $\phi$ has been described above.

How to determine the height h of the convex portion 20 will be now described.

In regard to the first side wall 21, the following equations hold:

$$L \sin\phi = h \quad (4),$$

and $$L \cos(\phi+\theta) = x_1 \quad (5),$$

Figure 3:
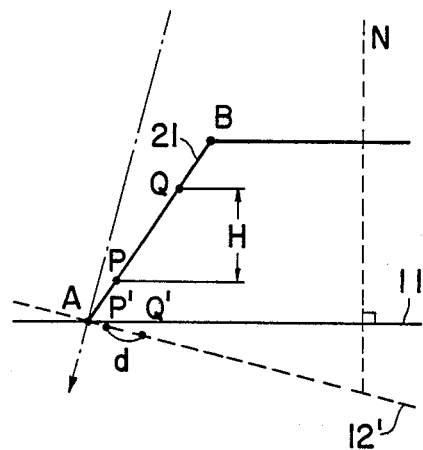
FIG. 3 is a diagrammatical view showing the principle for measuring the height of the convex pattern shown in FIG. 1.

By dividing both sides, $$h = x_1 \cdot \sin\phi / \cos(\phi+\theta) \quad (6)$$

is obtained. Since $x_1$ and $\theta$ are known values and $\phi$ is determined from the equation (3), h is eventually determined. Because distance $x_1$ between the projected image B' of the point B and the projected image A' of the point A is used in this example, height h of the trapezoid ABCD is determined. In addition, when arbitrary two points P and Q on the side walls are generally determined as shown in FIG. 3 to obtain a spacing d along the reference line 12' between respective points P' and Q' of projection, a spacing H in a direction of the normal N between points P and Q can be obtained using the following equation:

$$H = d \cdot \sin\phi / \cos(\phi+\theta) \quad (7).$$

Both taper angle $\phi$ and height h can be obtained in a manner stated above. It is to be noted that while measurement using convex portion 20 on substrate 10 as a pattern has been described in the above-mentioned embodiment, measurement using a concave portion bored in the substrate 10 as a pattern may be made in completely the same manner. In this case, h indicates the depth of the concave portion in place of the height.

Now, sensitivity S is defined as follows:

$$\cos(\phi - \theta)/\cos(\phi + \theta) = S \qquad (8)$$

Figure 4:
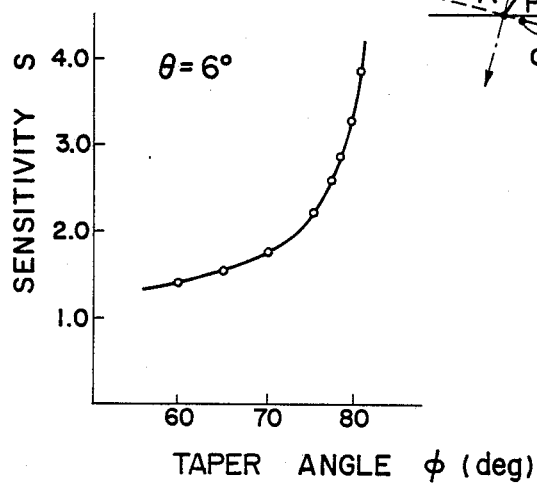
FIG. 4 is a graph showing the measurement sensitivity in a measurement method according to this invention.

When this definition is used, it is seen that the larger the sensitivity S is, the larger the ratio of $x_2$ to $x_1$ is, so that measured result having good accuracy is obtained. This sensitivity S is a function of $\phi$ and $\theta$ as shown by the equation (8). The relationship between the sensitivity S and the taper angle $\phi$ when $\theta = 6°$ is shown as a graph in FIG. 4. As indicated by this graph, when $\theta$ is set to 6 degrees, a very excellent sensitivity is exhibited in the vicinity of taper angle $\phi$ of 80 degrees. In general, many patterns on semiconductor substrates for semiconductor integrated circuits have a taper angle $\phi$ in the vicinity of 80 degrees. Namely, the graph of FIG. 4 shows that when this invention is applied to a pattern for a semiconductor integrated circuit, it is ideal to conduct an electron beam irradiation at $\theta$ equal to about 6 degrees, i.e., from a direction inclined by an angle of about 6 degrees from the normal.

Figure 5A:
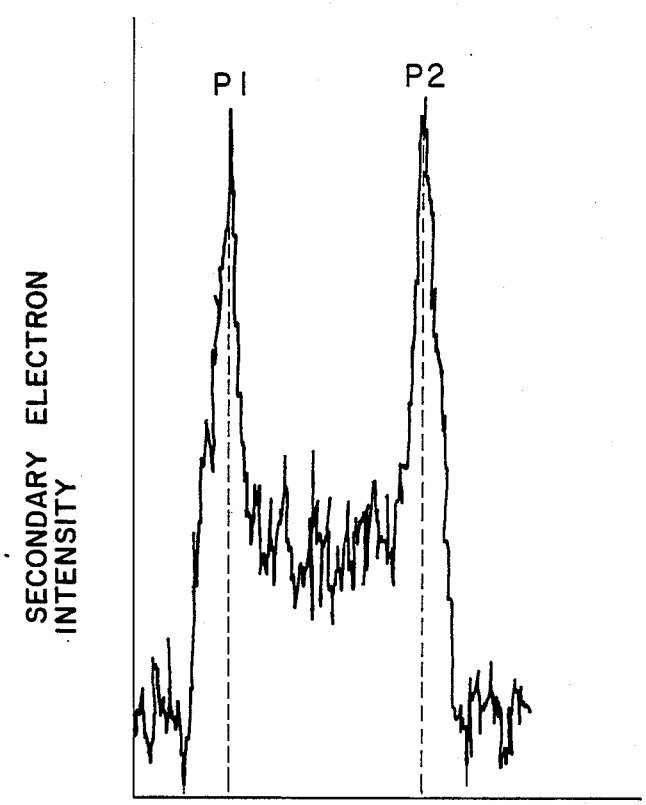
FIGS. 5(a, b) and 6(a, b) are views showing an embodiment in which the measurement method according to this invention is applied to a semiconductor integrated circuit pattern.
Figure 5B:
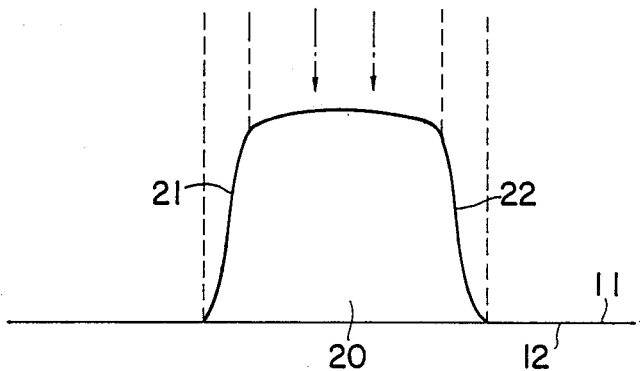
Figure 6A:
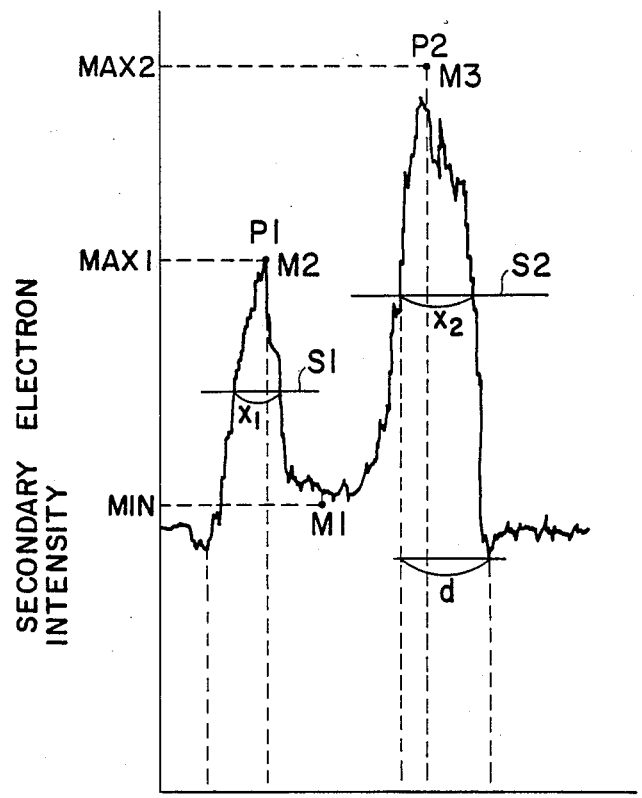
Figure 6B:
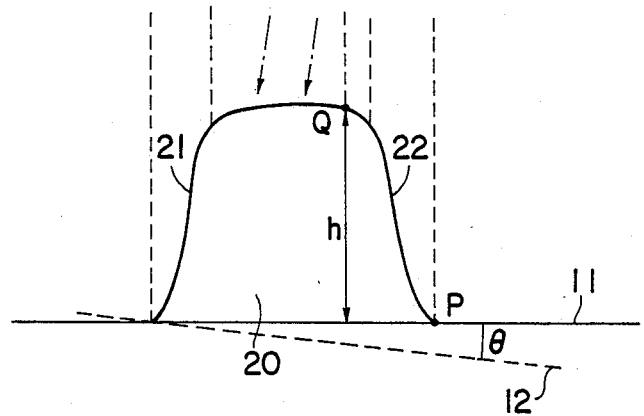

An embodiment in which this invention is actually applied to a measurement of a semiconductor integrated circuit pattern will be now described. In this embodiment, an electron beam is irradiated onto a convex pattern (e.g., resist layer) on a semiconductor substrate to observe secondary electron image using an electron microscope having a magnification of 20,000. FIG. 5 shows the case where $\theta = 0°$ and FIG. 6 shows the case where $\theta = 6°$. FIGS. 5(a) and 6(a) show one-dimensional projected image obtained, and FIGS. 5(b) and 6(b) show the cross section of the convex portion 20 formed on the reference plane 11. The one-dimensional projected image corresponds to a signal indicating the secondary electron intensity observed along the reference line 12' of FIG. 2. When an electron beam is irradiated at an angle of $\theta = 0$ as shown in FIG. 5, i.e., from a direction directly above the figure, because side walls 21 and 22 are (bi)symmetrical, signals obtained are substantially (bi)symmetrical. Because actual signals are greately influenced by the position of the secondary electron detector, they are not completely symmetrical. By broken lines drawn between FIG. 5(a) and (b), correspondence relationship therebetween can be understood. Peaks P1 and P2 correspond to shoulder portions of the side walls 21 and 22, respectively.

When an electron beam is irradiated at an angle of $\theta = 6°$ as shown in FIG. 6(b), i.e., from a diagonally right and upper direction (this may be carried out by inclining the electron beam itself or inclining the substrate 10), signals are not (bi)symmetrical as shown in FIG. 6(a). Also in this case, peaks P1 and P2 correspond to shoulder portions of the side walls 21 and 22, respectively, but widths of the respective peaks are different. Theoretically, it is sufficient to determine widths $x_1$ and $x_2$ as shown in FIG. 2. However, because the signal includes noises as shown in FIG. 6(a), there is unconditionally no saying which portion defines the widths of the peaks P1 and P2. In view of this, widths $x_1$ and $x_2$ are defined in this embodiment as follows. Namely, there is employed a scheme to determine a point M1 at which the signal takes the minimum value MIN at the portion between both peaks to determine a point M2 at which the signal takes the maximum value MAX1 of the peak P1 and a point M3 at which the signal takes the maximum value MAX 2 of the peak P2. Thus, a slice level S1 which takes an intermediate value between MIN and MAX1 and a slice level S2 which takes an intermediate value between MIN and MAX2 are defined, and widths of peaks at these slice levels are defined as $x_1$ and $x_2$, respectively. By using intermediate values as described above, stable width value having less influence of noise can be obtained. Such slice levels are not limited to an intermediate value, but they may be set at a position of 60% or 40% between MIN and MAX1. As a result of the fact that the equation (3) is applied to $x_1$ and $x_2$ obtained in this way to determine a taper angle $\phi$ of each of the side walls 21 and 22, $=78.5°$ is obtained. This value has become equal to a value considerably close to a taper angle 79.3° obtained from the cross sectional image of the same sample.

On the other hand, spacing h in upper and lower directions between points P and Q of the figure is used as a height (film thickness) of the convex portion 20. Accordingly, width d shown in FIG. 6(a) is used as d in the above equation (7). It is to be noted that because the width d is measured by an electron microscope, the value of an actual width d becomes equal to a value obtained by multiplying an observed value its magnification. As a result, $h = 1.41$ μm is obtained. This value was a value considerably close to a film thickness 1.45 μm obtained from the cross sectional image of the same sample.

The embodiment of the measurement of the taper angle $\phi$ and the film thickness h of the film formed on semiconductor substrate has been disclosed. In addition, this invention can be applied to measurement of taper angle and depth of a trench structure bored in the semiconductor substrate. In short, as long as a pattern to be measured is an uneven pattern having symmetry, this invention can be said to be a technology applicable not only to semiconductor integrated circuit pattern but also to any pattern.

As described above, when the method according to this invention is applied to the measurement of a semiconductor integrated circuit pattern, an electron microscope is used to observe secondary electron image by scanning electron beam to thereby obtain a projected image of pattern. However, various noises are produced generally in the electron microscope. As a result, S/N ratio is extremely lowered in the observation of a fine pattern such as a semiconductor integrated circuit. For this reason, when there is employed a scheme to use a pattern projected image obtained by the electron microscope as it is to make a measurement according to this invention, the measurement accuracy becomes bad. Accordingly, it is preferable to implement a suitable image processing to obtain a projected image having high S/N ratio. An example of such an image processing will be disclosed. The image processing shown here can improve picture quality even by itself, but it is preferable to successively conduct an image processing in order of (1) to (3). Since this image processing is described in the specification and the drawing of the application entitled "Image Formation Method" having the same filing date as that of this application, the detail thereof will be apparent by making a reference to that application.

(1) Additive Average Processing

This processing is a processing to repeatedly carry out a plurality of times of scans by an electron microscope to obtain average intensity of pixels present at corresponding positions, respectively, thus to form a new good image by the pixels having average intensity.

(2) Spatial Filter Processing

This processing is a processing to modify an intensity of one pixel on the basis of intensities of peripheral pixels thereof. In accordance with this method, factors proportional to the intensity distribution of electron beam of the electron microscope are assigned to the pixel subject to modification and the peripheral pixels thereof, respectively, to make a multiplication of intensities of respective pixels by the assigned factors to determine a new intensity of a pixel subject to modification on the basis of sum total of the products obtained. By implementing such a modification processing to all pixels, a good image having less noise component can be obtained.

(3) Linear Image enhancement Processing

This processing is a processing to apply linear conversion to intensities of respective pixels so that these intensities are distributed within a predetermined range. In a pattern measurement method according to this invention, it is preferable to digitally process image data obtained from an electron microscope. Accordingly, if respective pixel pixel intensities are distributed fully over an allowed data range of the digital processing system, high precision digital operation can be expected. For example, in a processing system where respective pixel data are represented by 8 bits, it is sufficient to implement a linear processing such that the minimum value of the pixel intensity is 0 and the maximum value thereof is 255.

Three image processing methods have been disclosed above, but these image processings are disclosed as preferred embodiments for obtaining a projected image of pattern. Therefore, such image processings are only considered to be incidental to this invention.

As described above, since a pattern measurement method according to this invention makes a measurement only using a projected image in one direction of a pattern by utilizing symmetry of the pattern, it is possible to easily make a high accuracy pattern measurement in non-destructive and non-contact manners.

We claim:

1. A method of measuring a pattern having first and second side walls which are uneven with respect to a reference plane and are plane-symmetrical with each other with respect to a plane of symmetry raised vertical to said reference plane, said method comprising the steps of:

obtaining a projected image of a pattern onto a plane of projection which forms a predetermined angle $\theta$ with respect to said reference plane;

defining a reference line which is a straight line orthogonal to an intersecting line of said plane of symmetry and said plane of projection, and included in said plane of projection to obtain a width $x_1$ in a direction of said reference line of a projected image of said first side wall and a width $x_2$ in the direction of said reference line of a projected image of said second side wall; and obtaining an angle $\phi$ that said first and second side walls and said reference plane form using an equation expressed as:

$$\cos(\phi+\theta)/\cos(\phi-\theta) = x_1/x_2.$$

2. A pattern measurement method as set forth in claim 1, wherein a projected image of said pattern is obtained by irradiating an electron beam from a direction of an angle $\theta$ with respect to a normal raised on said reference plane to observe secondary electron image emitted from said pattern on the basis of said electron beam.

3. A pattern measurement method as set forth in claim 2, wherein a plurality of times of observations of secondary electron image are conducted to conduct additive average of these observed results to obtain a projected image of said pattern to carry out a processing for modifying intensities of respective pixels constituting said projected image of said pattern on the basis of intensities of the peripheral pixels thereof to further carry out linear conversion so that intensities of respective pixels are distributed within a predetermined range, thus to obtain a final projected image of said pattern.

4. A pattern measurement method as set forth in claim 3, wherein secondary electron intensities related to a projected image are extracted in correspondence with positions on said reference line to set a predetermined secondary electron intensity value as a slice level to set widths along said slice level of peak portions of intensity values corresponding to said first and second side walls to said widths $x_1$ and $x_2$, respectively.

5. A pattern measurement method as set forth in claim 2, wherein secondary electron intensities related to a projected image are extracted in correspondence with positions on said reference line to set a predetermined secondary electron intensity value as a slice level to set widths along said slice level of peak portions of intensity values corresponding to said first and second side walls to said widths $x_1$ and $x_2$, respectively.

6. A pattern measurement method as set forth in claim 5, wherein an intermediate value between the maximum value and the minimum value of the secondary electron intensity in the vicinity of the side wall is set as a slice level.

7. A method of measuring a pattern having first and second side walls which are uneven with respect to a reference plane and are plane-symmetrical with each other with respect to a plane of symmetry raised vertical to said reference plane, said method comprising the steps of:

obtaining a projected image of a pattern onto a plane of projection which forms a predetermined angle $\theta$ with respect to said reference plane;

defining a reference line which is a straight line orthogonal to an intersecting line of said plane of symmetry and said plane of projection, and included in said plane of projection to determine a width $x_1$ in a direction of said reference line of a projected image of said first side wall and a width $x_2$ in the direction of said reference line of a projected image of said second side wall;

determining an angle $\phi$ that said first and second side walls and said reference plane form using an equation expressed as $$\cos(\phi+\theta)/\cos(\phi-\theta) = x_1/x_2;\text{ and}$$

determining projected points P' and Q' of predetermined points P and Q on said side walls, respectively, to determine a spacing d' between said projected points P' and Q', thus to determine a spacing H related to a direction of a normal raised on said reference plane between said predetermined points P and Q using an expression expressed as $$H = d \cdot \sin\phi/\cos(\phi+\theta).$$

8. A pattern measurement method as set forth in claim 7, wherein a projected image of said pattern is obtained by irradiating an electron beam from a direction of an angle $\theta$ with respect to a normal raised on said reference plane to observe second electron image emitted from said pattern on the basis of said electron beam.

9. A pattern measurement method as set forth in claim 8, wherein a plurality of times of observations of secondary electron image are conducted to conduct additive average processing of these observed results to obtain a projected image of said pattern to carry out a processing for modifying intensities of respective pixels constituting said projected image of said pattern on the basis of intensities of the peripheral pixels thereof to further carry out linear conversion so that intensities of respective pixels are distributed within a predetermined range, thus to obtain a final projected image of said pattern.

10. A pattern measurement method as set forth in claim 8, wherein secondary electron intensities related to a projected image are extracted in correspondence with positions on said reference line to set a predetermined secondary electron intensity value as a slice level to set widths along said slice level of peak portions of intensity values corresponding to said first and second side walls to widths $x_1$ and $x_2$, respectively.

11. A pattern measurement method as set forth in claim 9, wherein secondary electron intensities related to a projected image are extracted in correspondence with positions on said reference line to set a predetermined secondary electron intensity value as a slice level to set widths along said slice level of peak portions of intensity values corresponding to said first and second side walls to widths $x_1$ and $x_2$, respectively.

12. A pattern measurement method as set forth in claim 10, wherein an intermediate value between the maximum value and the minimum value of the secondary electron intensity in the vicinity of the side wall is set as a slice level.

13. A pattern measurement method as set forth in claim 7, wherein a point on said reference plane is determined as a predetermined point P to determine a distance H between a predetermined point P and said reference plane.

* * * * *